United States Patent [19]
Mastroianni

[11] Patent Number: 5,011,791
[45] Date of Patent: Apr. 30, 1991

[54] FUSIBLE LINK WITH BUILT-IN REDUNDANCY

[75] Inventor: Sal T. Mastroianni, Tempe, Ariz.

[73] Assignee: Motorola, Inc., Schaumburg, Ill.

[21] Appl. No.: 305,575

[22] Filed: Feb. 3, 1989

[51] Int. Cl.[5] .................... H01L 21/441; H01L 21/44
[52] U.S. Cl. .................... 437/180; 437/922; 148/DIG. 55
[58] Field of Search ............... 437/180, 922, 186, 187, 437/189, 196, 203

[56] References Cited

U.S. PATENT DOCUMENTS 4,358,340 11/1982 Fu .......................................... 437/187
4,542,577 9/1985 Jackson ................................ 437/180
4,619,037 10/1986 Taguchi et al. ...................... 437/203

FOREIGN PATENT DOCUMENTS 237441 10/1988 Japan .................................. 437/203

Primary Examiner—Brian E. Hearn
Assistant Examiner—Linda J. Fleck
Attorney, Agent, or Firm—Joe E. Barbee; Miriam Jackson

[57] ABSTRACT

A fusible link is fabricated using sidewall spacer technology. The fusible link of the present requires low fusing power because a fusible link having a small cross-sectional area is obtainable. A conductive or semiconductive, fusible sidewall spacer is formed around a platform or in a well of a dielectric layer. Each fusible link may have two fusible portions per site, resulting in a built-in redundancy. Alternatively, the packing density of the fusible links may be increased by using each side of the fusible sidewall spacer as a fusible link. This process is compatible with bipolar and BICMOS processes used in fabricating high performance memory devices.

6 Claims, 1 Drawing Sheet

FUSIBLE LINK WITH BUILT-IN REDUNDANCY

BACKGROUND OF THE INVENTION

This invention relates, in general, to semiconductor devices, and more particularly, to a method of making fusible links on integrated circuit devices.

Memory elements are used in integrated circuit memory devices, such as Programmable Array Logic devices (PAL's), Programmable Logic Array devices (PLA's), or Programmable Read Only Memories (PROM's) to produce field programmable products. Memory elements can be horizontal, metallic, fusible links; transistors which are shorted when sufficient reverse current is supplied; or floating gate transistors which can be turned on and off by introducing and releasing charge on the gate.

Metallic fusible links are typically employed in high performance applications using bipolar/BICMOS technologies. In a memory array, a transistor supplies sufficient current to blow the fusible link to create an open circuit between a selected pair of bit and word lines. Fusible links remain intact to represent one logic state, and are fused open to represent the opposite logic state. The amount of energy required for fusing open a fusible link is determined primarily by the fusible link cross-sectional area in the fusing portion. Other parameters which affect the amount of energy required for fusing are the resistivity, thermal conductivity, and melting temperature of the fusible link material.

In the past, fusible links have been fabricated by using a thin, horizontal, conductive or semiconductive film of either polysilicon, nickel chrome, platinum silicide, or titanium tungsten. A disadvantage of fabricating the fusible links in this manner is that a high fusing power is required for fusing. This means that larger transistors and diodes must be provided to handle the larger currents. The fusing power required can not be significantly reduced because a reduction of the fusible link cross-sectional area is limited. The thickness of the fusible link material is typically on the order of 1000 angstroms. The width of the link is on the order of 2 microns and can not be reduced due to photolithography constraints. Thus, there is a need to provide a means of fabricating a fusible link having a smaller cross-sectional area than can be defined by the method described above. A fusible link having a smaller cross-sectional area will require a lower fusing power. Smaller transistors and diodes can be used, thereby reducing the die size of the integrated circuit memory device.

Another disadvantage of the fusible links made in the past is that a defect in the fusible link may cause the link to be open. Thus, there is also a need to provide a fusible link having a built-in redundancy. Built-in redundancy would provide two separate fusible portions in one fusible link element, so that if there is a defective portion on the fusible link, an intact fuse state is still formed.

By now, it should be appreciated that it would be advantageous to provide an improved fusible link requiring lower fusing power and a built-in redundancy.

Accordingly, it is an object of the present invention to provide a method of fabricating a fusible link having a small cross-sectional area, thus requiring low fusing power.

Another object of the present invention is to provide method of fabricating a fusible link which is compatible with modern bipolar and BICMOS processes.

An additional object of the present invention is to provide a fusible link having a built-in redundancy by fabricating the fusible link with two fusible portions.

A further object of the present invention is to increase the packing density of fusible links on an integrated circuit area.

SUMMARY OF THE INVENTION

In accordance with the present invention, the above and other objects and advantages are achieved by providing a fusible link made of a conductive or semiconductive film using sidewall spacer technology. The fusible link has a small cross-sectional area, thus requires low fusing power. The fusible link also has two fusible portions per site, therefore, has a built-in redundancy. This process is compatible with modern processes used to make high performance memory devices, such as bipolar and BICMOS processes.

The preferred embodiments of the present invention are illustrated in the accompanying drawings for purposes of exemplification, and are not to be construed as limiting in any manner.

DETAILED DESCRIPTION OF THE DRAWINGS

Figure 1:
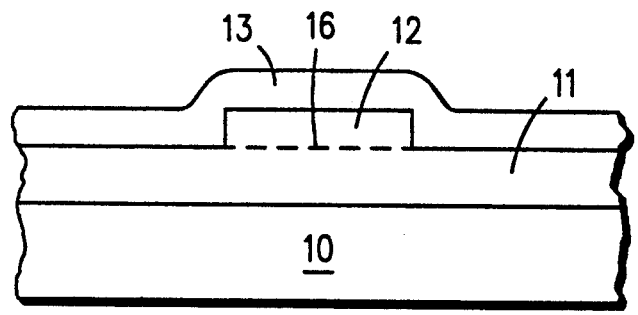
FIGS. 1-2 illustrate enlarged cross-sectional views of a structure embodying the present invention in various stages of development.
Figure 2:
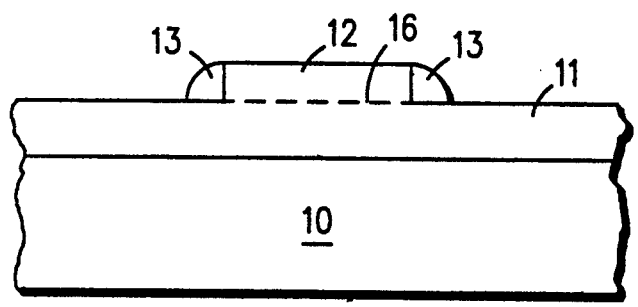
Figure 3:
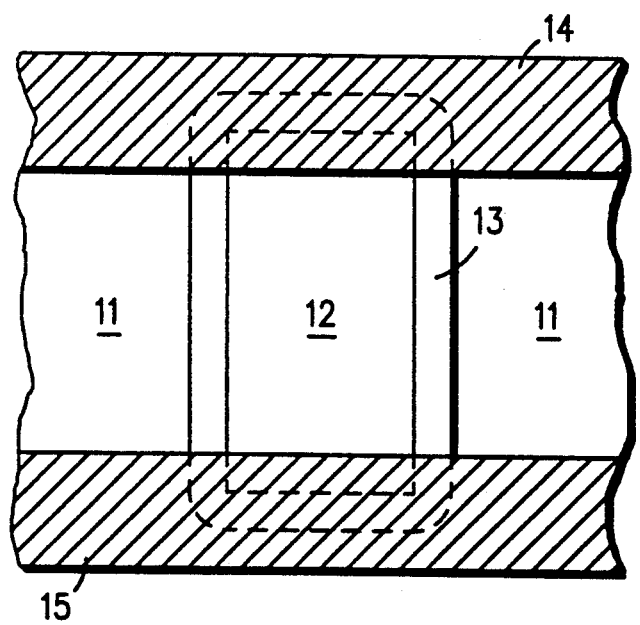
FIG. 3 illustrates an enlarged top view of a structure embodying the present invention.

FIGS. 1-3 illustrate one embodiment of the present invention in various stages of development. FIG. 1 illustrates a semiconductor substrate 10 with a dielectric layer 11 deposited thereon. Substrate 10 will have semiconductor devices built therein, however, they are not illustrated here. A second dielectric layer 12 is deposited on layer 11 and then patterned to leave a transition or platform 12. Dielectric layer 11 and 12 can be comprised of two different dielectrics having an interface at dotted line 16. Dielectric layers 11 and 12 can also be comprised of a single dielectric layer which is patterned to form a platform 12. In a preferred embodiment, dielectric layers 11 and 12 would be a single layer of oxide, however, dielectric layers 11 and 12 can be any combination of oxide, nitride, or the like. A fusible layer 13 is then formed on dielectric layers 11 and 12. Fusible layer 13 is made of a conductive or semiconductive material such as doped polysilicon, silicided polysilicon, a metallic, or the like. Dielectric layers 11 and 12, and fusible layer 13 are deposited by any standard processes known in the art.

FIG. 2 illustrates the structure of FIG. 1 with fusible layer 13 partially etched to form a fusible sidewall spacer 13. Layer 13 is etched in the same manner that is used to form a dielectric sidewall spacer. In a preferred embodiment, fusible sidewall spacer 13 is formed by employing a directional etch, such as a Reactive Ion Etch (RIE), that only etches in the vertical direction. In addition, a combination of a vertical and a horizontal etch may be used as long as fusible sidewall spacer 13 is not completely removed. Sidewall spacer technology is common in bipolar and BICMOS integrated circuit processes. Typically, sidewall spacers are dielectric spacers used to isolate two electrodes by a submicron distance. In the present invention, layer 13 is not a dielectric layer, but a conductive or semiconductive layer which is fusible. Since sidewall spacer technology is commonly used in bipolar and BICMOS processes, the process illustrated here can be easily integrated into the structure shown.

As one can note from FIG. 2, the cross-sectional area of fusible sidewall spacer 13 is very small. Photolithograpy does not limit the width of fusible sidewall spacer 13 as in the prior art. In the present invention, the thickness and the width can both be on the order of approximately 1000 angstroms. The small cross-sectional area results in low power required to fuse open a fusible link made with a fusible sidewall spacer 13 and can still facilitate low fuse resistances by virtue of proper choice of materials. The present invention allows for more flexibility in choosing a conductive or semiconductive layer 13 having a higher melting temperature, because the cross-sectional area can be greatly reduced.

FIG. 3 illustrates the structure of FIG. 2 from a top view. The structure is also illustrated having two electrodes 14 and 15 making electrical contact to fusible sidewall spacer 13. As one can note from FIG. 3, a fusible link is formed having two fusible portions per site, thereby providing for a built-in redundancy. If one portion of fusible sidewall spacer 13 is defective, the other portion can still be fused open or left intact. If there are no defects, both portions will fuse. A fusible link may also be fabricated without having a built-in redundancy, if desired, by providing four electrodes (not illustrated), instead of only two electrodes 14 and 15, making contact to fusible sidewall spacer 13. In this manner, up to four fusible links can be provided by using each side of fusible sidewall spacer 13 as a fusible link. Thus, the packing density of fusible links on a given semiconductor device area can be increased substantially.

Figure 4:
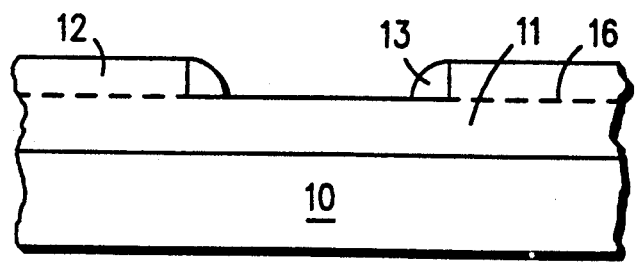
FIG. 4 illustrates an enlarged cross-sectional view of a second embodiment of the present invention.

FIG. 4 illustrates a second embodiment of the present invention. Dielectric layers 11 and 12 are deposited on substrate 10 and a fusible sidewall spacer 13 is fabricated thereon as in FIGS. 1 and 2. FIG. 4 is very similar to FIG. 2 except that fusible sidewall spacer 13 is formed inside a transition that is a well in dielectric layers 11 and 12 rather than on a platform as in FIG. 1. Furthermore, dielectric layers 11 and 12 can be comprised of two different dielectric layers having an interface at dotted line 16, or a single dielectric layer as described in FIG. 1.

By now it should be appreciated that there has been provided a new and improved method of fabricating a fusible link element which is compatible with modern bipolar and BICMOS processes.

I claim:

1. A method of making a fusible sidewall spacer, comprising the steps of:
   providing a semiconductor substrate;
   forming a dielectric layer on the substrate;
   patterning a transition having four sides in the dielectric layer;
   forming a fusible material on the dielectric layer; and
   partially removing the fusible material to form the fusible sidewall spacer along the transition in the dielectric layer.

2. The method of claim 1 further comprising providing electrodes making contact to the fusible sidewall spacer to provide for a fusible link having a built-in redundancy.

3. The method of claim 1 further comprising providing electrodes making contact to the fusible sidewall spacer to provide for at least two fusible links.

4. The method of claim 1 further comprising providing electrodes making contact to the fusible sidewall spacer to provide for a fusible link on each side of the transition.

5. The method of claim 1 wherein the material from which the fusible sidewall spacer is formed is a conductive material.

6. The method of claim 1 wherein the material from which the fusible sidewall spacer is formed is a semiconductive material.

* * * * *